United States Patent
Li

(10) Patent No.: US 10,134,338 B2
(45) Date of Patent: Nov. 20, 2018

(54) INVERTER, GATE DRIVING CIRCUIT AND DISPLAY APPARATUS

(71) Applicant: BOE Technology Group Co., Ltd., Beijing (CN)

(72) Inventor: Quanhu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 265 days.

(21) Appl. No.: 15/097,534

(22) Filed: Apr. 13, 2016

(65) Prior Publication Data

US 2017/0025057 A1 Jan. 26, 2017

(30) Foreign Application Priority Data

Jul. 23, 2015 (CN) .......................... 2015 1 0438874

(51) Int. Cl.
*G09G 3/30* (2006.01)
*G09G 3/3266* (2016.01)
*G11C 19/28* (2006.01)

(52) U.S. Cl.
CPC ... *G09G 3/3266* (2013.01); *G09G 2310/0286* (2013.01); *G11C 19/287* (2013.01)

(58) Field of Classification Search
CPC .................................................. G09G 3/30
See application file for complete search history.

(56) References Cited

U.S. PATENT DOCUMENTS 5,705,895 A 1/1998 Mihara 7,342,576 B2 3/2008 Chegal
7,486,268 B2 2/2009 Jang et al.
7,589,706 B2 9/2009 Chou
(Continued)

FOREIGN PATENT DOCUMENTS

CN 1629925 A 6/2005
CN 1637829 A 7/2005
(Continued)

OTHER PUBLICATIONS

First Office Action, including Search Report, for Chinese Patent Application No. 201510438874.X, dated Feb. 13, 2017, 8 pages.

*Primary Examiner* — Hai L Nguyen
(74) *Attorney, Agent, or Firm* — Westman, Champlin & Koehler, P.A.

(57) ABSTRACT

The present disclosure relates to display technology, and provides an inverter, a gate driving circuit and a display apparatus, capable of solving the problem that it is difficult to apply Scan Power technology in the display apparatus since a power signal outputted from the inverter has a small current. The inverter comprises: a current amplification module configured to amplify a current of the output terminal of the inverter based on a signal at a first clock signal terminal, a signal at a second clock signal terminal, a signal at a third clock signal terminal, a signal at a fourth clock signal terminal, a signal at a first input signal terminal, and a signal at a second input signal terminal, and to control the output terminal of the inverter to output a high level signal; and a pull-down module configured to control the output terminal of the inverter to output a low level signal. The inverter according to the present disclosure may be applied in a display apparatus employing the Scan Power technology.

9 Claims, 5 Drawing Sheets

(56) References Cited

U.S. PATENT DOCUMENTS

| | | | |
|---|---|---|---|
| 8,344,989 B2 * | 1/2013 | Kim | G09G 3/3677 345/100 |
| 9,208,745 B2 | 12/2015 | Son et al. | |
| 2004/0151041 A1 | 8/2004 | Lee et al. | |
| 2008/0048712 A1 | 2/2008 | Ahn et al. | |
| 2011/0228893 A1 | 9/2011 | Tobita et al. | |

FOREIGN PATENT DOCUMENTS

| | | |
|---|---|---|
| CN | 101044545 A | 9/2007 |
| CN | 101944344 A | 1/2011 |
| CN | 102368378 A | 3/2012 |
| CN | 102800292 A | 11/2012 |
| CN | 103187040 A | 7/2013 |
| CN | 103854622 A | 6/2014 |
| CN | 103996390 A | 8/2014 |
| KR | 10-2007-0037795 A | 4/2007 |

* cited by examiner

INVERTER, GATE DRIVING CIRCUIT AND DISPLAY APPARATUS

CROSS-REFERENCE TO RELATED APPLICATION(S)

This application claims priority to the Chinese Patent Application No. 201510438874.X, filed on Jul. 23, 2015, entitled "INVERTER, GATE DRIVING CIRCUIT AND DISPLAY APPARATUS," which is incorporated herein by reference in its entirety.

TECHNICAL FIELD

The present disclosure relates to display technology, and more particularly, to an inverter, a gate driving circuit and a display apparatus.

BACKGROUND

In a display apparatus, a pixel array includes intersecting gate scan lines, data lines and a plurality of pixel units enclosed by the gate scan lines and the data lines. In order to progressively scan the pixel units in the pixel array, a gate driving circuit is usually used to drive the pixel units in the pixel array. At present, an Organic Light Emitting Diode (OLED) pixel structure designed in Scan Power technology (a technology for scanning AC Power) is often employed, so as to simplify the pixel structure and improve the aperture ratio of pixel and the product yield.

Currently, on one hand, since a pull-up transistor of an inverter in the gate driving circuit is normally on, there is a current leakage in the inverter. On the other hand, since the pull-up transistor of the inverter has a small gate-source voltage difference, the maximum output current of a power signal outputted from the inverter is small and thus a power signal having the maximum output current satisfying a certain threshold is not available. For the OLED pixel structure designed in Scan Power technology, it is needed to provide a large current so as to output a high level. It is difficult for the conventional inverter to apply the Scan Power technology in a display apparatus.

SUMMARY

It is an object of the present disclosure to provide an inverter, a gate driving circuit and a display apparatus for increasing a current of a power signal outputted from an output terminal of the inverter, so as to apply the Scan Power technology in the display apparatus.

In a first aspect, the present disclosure provides an inverter. The inverter comprises:

a current amplification module connected to a first clock signal terminal, a second clock signal terminal, a third clock signal terminal, a fourth clock signal terminal, a first input signal terminal, a second input signal terminal, a high level terminal, a low level terminal and an output terminal of the inverter, and configured to amplify a current of the output terminal of the inverter based on a signal at the first clock signal terminal, a signal at the second clock signal terminal, a signal at the third clock signal terminal, a signal at the fourth clock signal terminal, a signal at the first input signal terminal, and a signal at the second input signal terminal, and to control the output terminal of the inverter to output a high level signal; and a pull-down module connected to the first input signal terminal, the low level terminal and the output terminal of the inverter, and configured to control the output terminal of the inverter to output a low level signal.

In a second aspect, the present disclosure provides a gate driving circuit comprising a plurality of stages of shift register units, each of which is connected to the inverter of the first aspect.

In a third aspect, the present disclosure provides a display apparatus comprising the gate driving circuit of the second aspect.

The inverter according to the present disclosure comprises the current amplification module and the pull-down module. The current amplification module can amplify a current outputted from the output terminal of the inverter based on a signal at the first clock signal terminal, a signal at the second clock signal terminal, a signal at the third clock signal terminal, a signal at the fourth clock signal terminal, a signal at the first input signal terminal, and a signal at the second input signal terminal. With compared to the conventional inverter having a current leakage, the inverter according to the present disclosure can amplify the current outputted from the output terminal of the inverter. Since the output terminal of the inverter according to the present disclosure outputs a power signal, and the inverter may increase the maximum output current of the power signal outputted from its own output terminal, thereby it can apply the Scan Power technology in the display apparatus.

BRIEF DESCRIPTION OF THE DRAWINGS

The above and other aspects, features and advantages of the embodiments of the present disclosure will become more apparent with reference to the following detailed description taken in conjunction with the figures, in which.

DETAILED DESCRIPTION OF THE EMBODIMENTS

In the following, the inverter, the gate driving circuit and the display apparatus according to embodiments of the present disclosure will be described in detail with reference to the figures.

First Embodiment

Figure 1:
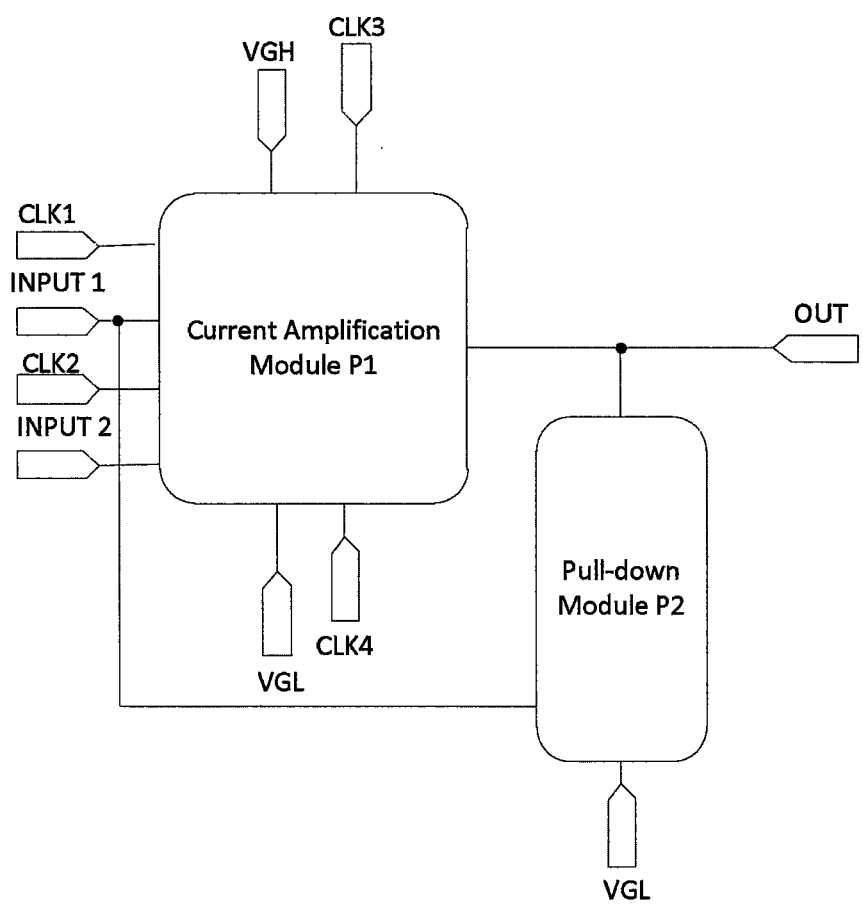
FIG. 1 is a structure diagram of an inverter according to a first embodiment of the present disclosure.

Referring to FIG. 1, an inverter according to this embodiment of the present disclosure comprises a current amplification module P1 and a pull-down module P2. The current amplification module P1 is connected to a first clock signal terminal CLK1, a second clock signal terminal CLK2, a third clock signal terminal CLK3, a fourth clock signal terminal CLK4, a first input signal terminal INPUT 1, a second input signal terminal INPUT 2, a high level terminal VGH, a low level terminal VGL and an output terminal OUT of the inverter. The current amplification module P1 is configured to amplify a current of the output terminal OUT of the inverter based on a signal at the first clock signal terminal CLK1, a signal at the second clock signal terminal CLK2, a signal at the third clock signal terminal CLK3, a signal at the fourth clock signal terminal CLK4, a signal at the first input signal terminal INPUT 1 and a signal at the second input signal terminal INPUT 2, and to control the output terminal OUT of the inverter to output a high level signal. The pull-down module P2 is connected to the first input signal terminal INPUT 1, the low level terminal VGL and the output terminal OUT of the inverter. The pull-down module P2 is configured to control the output terminal OUT of the inverter to output a low level signal.

The inverter according to this embodiment of the present disclosure comprises the current amplification module P1 and the pull-down module P2. The current amplification module P1 can amplify a current outputted from the output terminal OUT of the inverter based on a signal at the first clock signal terminal CLK1, a signal at the second clock signal terminal CLK2, a signal at the third clock signal terminal CLK3, a signal at the fourth clock signal terminal CLK4, a signal at the first input signal terminal INPUT 1 and a signal at the second input signal terminal INPUT 2. With compared to the conventional inverter having a current leakage, the inverter according to the present disclosure can amplify the current outputted from the output terminal OUT of the inverter. The output terminal OUT of the inverter outputs a power signal. In this case, the inverter according to the present disclosure can increase the current of the power signal outputted from its own output terminal, so that it may achieve the Scan Power technology in the display apparatus. Moreover, the inverter according to the present disclosure is connected to four clock signal terminals. When at least one clock signal terminal is switched between a high level signal and a low level signal, the remaining clock signal terminals can stably output signals, thereby ensuring that the output terminal of the inverter can stably output the current.

It should be noted that in order to simplify the pixel structure, an OLED pixel structure using EM technology (Switch Direct Current Power Supply Technology) is also adopted. For the OLED pixel structure employing an EM switch, it is required that a high level signal outputted from the inverter does not decrease with respect to the inputted high level signal, and that a transistor at the output terminal may be turned on only when a gate-source voltage difference of the transistor goes beyond a threshold voltage, which gate-source voltage difference may be different with different operation conditions for the transistor and may increase with passing of the time. However, when the conventional inverter outputs a high level, a transistor at the output terminal has a gate voltage closing to an inputted high level signal and thus the gate-source voltage difference is small, and the output terminal of the inverter outputs a voltage having a small amplitude, which has poor stability for a long time. Compared with the conventional inverter, the current amplification module P1 of the inverter according to the present disclosure can amplify a current outputted from the output terminal OUT of the inverter and increase a gate-source voltage different of the transistor at the output terminal. Even if a pull-up transistor of the inverter has a threshold voltage fluctuating within a certain range, it can be ensured that the output terminal OUT of the inverter outputs a high level signal without any loss. Hence, the inverter according to the present disclosure is also applied in a display apparatus employing the EM switch technology.

Second Embodiment

Figure 2:
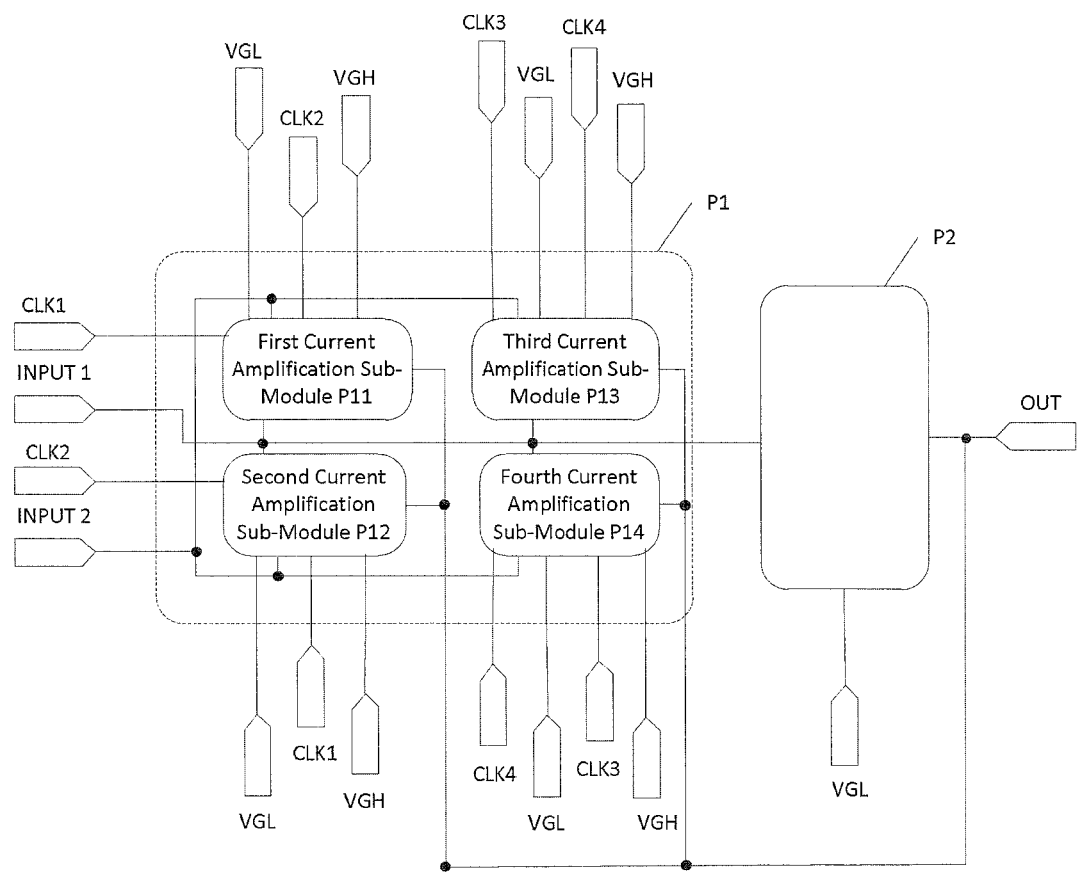
FIG. 2 is a structure diagram of an inverter according to a second embodiment of the present disclosure.

Referring to FIG. 2, the current amplification module P1 according to the first embodiment may comprise a first current amplification sub-module P11, a second current amplification sub-module P12, a third current amplification sub-module P13 and a fourth current amplification sub-module P14. The first current amplification sub-module P11 is connected to the first clock signal terminal CLK1, the second clock signal terminal CLK2, the first input signal terminal INPUT 1, the second input signal terminal INPUT 2, the high level terminal VGH, the low level terminal VGL and the output terminal OUT of the inverter. The first current amplification sub-module P11 is configured to amplify a current fed into the output terminal OUT of the inverter based on a signal at the first clock signal terminal CLK1, a signal at the second clock signal terminal CLK2, a signal at the first input signal terminal INPUT 1 and a signal at the second input signal terminal INPUT 2, and to control the output terminal OUT of the inverter to output a high level signal. The second current amplification sub-module P12 is connected to the first clock signal terminal CLK1, the second clock signal terminal CLK2, the first input signal terminal INPUT 1, the second input signal terminal INPUT 2, the high level terminal VGH, the low level terminal VGL and the output terminal OUT of the inverter. The second current amplification sub-module P12 is configured to amplify a current fed into the output terminal OUT of the inverter based on a signal at the first clock signal terminal CLK1, a signal at the second clock signal terminal CLK2, a signal at the first input signal terminal INPUT 1 and a signal at the second input signal terminal INPUT 2, and to control the output terminal OUT of the inverter to output a high level signal. The third current amplification sub-module P13 is connected to the third clock signal terminal CLK3, the fourth clock signal terminal CLK4, the first input signal terminal INPUT 1, the second input signal terminal INPUT 2, the high level terminal VGH, the low level terminal VGL and the output terminal OUT of the inverter. The third current amplification sub-module P13 is configured to amplify a current fed into the output terminal OUT of the inverter based on a signal at the third clock signal terminal CLK3, a signal at the fourth clock signal terminal CLK4, a signal at the first input signal terminal INPUT 1 and a signal at the second input signal terminal INPUT 2, and to control the output terminal OUT of the inverter to output a high level signal. The fourth current amplification sub-module P14 is connected to the third clock signal terminal CLK3, the fourth clock signal terminal CLK4, the first input signal terminal INPUT 1, the second input signal terminal INPUT 2, the high level terminal VGH, the low level terminal VGL and the output terminal OUT of the inverter. The fourth current amplification sub-module P14 is configured to amplify a current fed into the output terminal OUT of the inverter based on a signal at the third clock signal terminal CLK3, a signal at the fourth clock signal terminal CLK4, a signal at the first input signal terminal INPUT 1 and a signal at the second input signal terminal INPUT 2, and to control the output terminal OUT of the inverter to output a high level signal.

It is to be noted that a signal at the first clock signal terminal CLK1 and a signal at the second clock signal terminal CLK2 are opposite in phase, and a signal at the third clock signal terminal CLK 3 and a signal at the fourth clock signal terminal CLK4 are opposite in phase. That is, when a signal at the first clock signal terminal CLK1 is a high level signal, a signal at the second clock signal terminal CLK2 is a low level signal. When a signal at the third clock signal terminal CLK3 is a high level signal, a signal at the fourth clock signal terminal CLK4 is a low level signal. The inverter is configured in such a manner that the first current amplification sub-module P11 and the second current amplification sub-module P12 amplify a current fed into the output terminal OUT of the inverter in turn, and the third current amplification sub-module P13 and the fourth current amplification sub-module P14 amplify a current fed into the output terminal OUT of the inverter in turn. In this way, the lifetime of respective transistors in the first current amplification sub-module P11, the second current amplification sub-module P12, the third current amplification sub-module P13 and the current amplification sub-module P14 can be prolonged, and thereby the lifetime of the inverter can be prolonged.

Moreover, there may be a delay in the signal at the first clock signal terminal CLK1 and the signal at the second clock signal terminal CLK2 raising to a high level or falling to a low level. In order to avoid an unstable current outputted from the inverter caused by such delay, it is set that the signal at the first clock signal terminal CLK 1 has a raising edge or a falling edge corresponding to a high level or a low level of the signal at the third clock signal terminal CLK3, and that the signal at the second clock signal terminal CLK 2 has a raising edge or a falling edge corresponding to a high level or a low level of the signal at the fourth clock signal terminal CLK4. The signal at the third clock signal terminal CLK 3 and the signal at the fourth clock signal terminal CLK 4 are used to compensate for the delay during the raising or the falling of the signals at the first clock signal terminal CLK 1 and the second clock signal terminal CLK2, thereby avoiding occurrence of noises in the output wave caused by the delay. Meanwhile, the third current amplification sub-module P13 and the fourth current amplification sub-module P14 may share the task of generating a current of the first current amplification sub-module P11 and the second current amplification sub-module P12. This can prolong the lifetime of respective transistors in the first current amplification sub-module P11, the second current amplification sub-module P12, the third current amplification sub-module P13 and the fourth current amplification sub-module P14, thereby prolonging the lifetime of the inverter. With certain limits of technologies, i.e., in case that a single transistor can withstand a limited current, the third current amplification sub-module and the fourth current amplification sub-module can also assist the first current amplification sub-module and the second current amplification sub-module in improving the maximum output current capability of the inverter.

Third Embodiment

Figure 3:
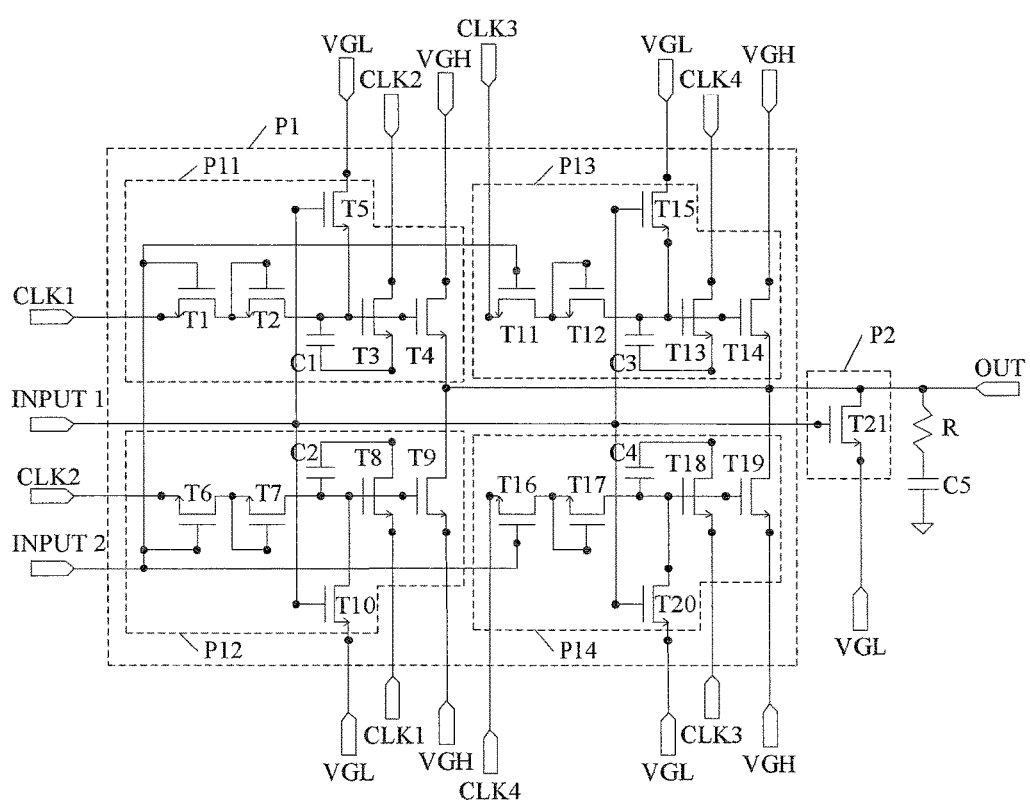
FIG. 3 is a structure diagram of an inverter according to a third embodiment of the present disclosure.

Referring to FIG. 3, the following description will describe structures of the first current amplification sub-module P11, the second current amplification sub-module P12, the third current amplification sub-module P13, the fourth current amplification sub-module P14 and the pull-down module P2 according to the second embodiment, and respective connection relationships among the structures.

The first current amplification sub-module P11 comprises a first transistor T1, a second transistor T2, a third transistor T3, a fourth transistor T4, a fifth transistor T5 and a first capacitor C1. The first transistor T1 has a gate connected to the second input signal terminal INPUT 2, a source connected to the first clock signal terminal, CLK1 and a drain connected to a gate and a source of the second transistor T2. The gate of the second transistor T2 is connected to the source of the second transistor T2, and the second transistor T2 has a drain connected to a gate of the third transistor T3, a gate of the fourth transistor T4, a source of the fifth transistor T5 and a first terminal of the first capacitor C1. The gate of the third transistor T3 is connected to the gate of the fourth transistor T4, the source of the fifth transistor T5 and the first terminal of the first capacitor C1, and the third transistor T3 has a source connected to a second terminal of the first capacitor C1 and a drain connected to the second clock signal terminal CLK2. The gate of the fourth transistor T4 is connected to the source of the fifth transistor T5 and the first terminal of the first capacitor C1, and the fourth transistor T4 has a source connected to the output terminal OUT of the inverter and a drain connected to the high level terminal VGH. The fifth transistor T5 has a gate connected to the first input signal terminal INPUT 1 and a drain connected to the low level terminal VGL, and the source of the fifth transistor T5 is connected to the first terminal of the first capacitor C1.

The second current amplification sub-module P12 comprises a sixth transistor T6, a seventh transistor T7, an eighth transistor T8, a ninth transistor T9, a tenth transistor T10 and a second capacitor C2. The sixth transistor T6 has a gate connected to the second input signal terminal INPUT 2, a source connected to the second clock signal terminal CLK2, and a drain connected to a gate and a source of the seventh transistor T7. The gate of the seventh transistor T7 is connected to the source of the seventh transistor T7, and the seventh transistor T7 has a drain connected to a gate of the eighth transistor T8, a gate of the ninth transistor T9, a drain of the tenth transistor T10 and a first terminal of the second capacitor C2. The gate of the eighth transistor T8 is connected to the gate of the ninth transistor T9, the drain of the tenth transistor T10 and the first terminal of the second capacitor C2, and the eighth transistor T8 has a source connected to the first clock signal terminal CLK1 and a drain connected to a second terminal of the second capacitor C2. The gate of the ninth transistor T9 is connected to the drain of the tenth transistor T10 and the first terminal of the second capacitor C2, and the ninth transistor T9 has a source connected to the high level terminal VGH and a drain connected to the output terminal OUT of the inverter. The tenth transistor T10 has a gate connected to the first input signal terminal INPUT 1 and a source connected to the low level terminal VGL, and the drain of the tenth transistor T10 is connected to the first terminal of the second capacitor C2.

The third current amplification sub-module P13 comprises an eleventh transistor T11, a twelfth transistor T12, a thirteenth transistor T13, a fourteenth transistor T14, a fifteenth transistor T15 and a third capacitor C3. The eleventh transistor T11 has a gate connected to the second input signal terminal INPUT 2, a source connected to the third clock signal terminal CLK3, and a drain connected to a gate and a source of the twelfth transistor T12. The gate of the twelfth transistor T12 is connected to the source of the twelfth transistor T12, and the twelfth transistor T12 has a drain connected to a gate of the thirteenth transistor T13, a gate of the fourteenth transistor T14, a source of the fifteenth transistor T15 and a first terminal of the third capacitor C3. The gate of the thirteenth transistor T13 is connected to the gate of the fourteenth transistor T14, the source of the fifteenth transistor T15 and the first terminal of the third capacitor C3, and the thirteenth transistor T13 has a source connected to a second terminal of the third capacitor C3 and a drain connected to the fourth clock signal terminal CLK4. The gate of the fourteenth transistor T14 is connected to the source of the fifteenth transistor T15 and the first terminal of the third capacitor C3, and the fourteenth transistor T14 has a source connected to the output terminal OUT of the inverter and a drain connected to the high level terminal VGH. The fifteenth transistor T15 has a gate connected to the first input signal terminal INPUT 1 and a drain connected to the low level terminal VGL, and the source of the fifteenth transistor T15 is connected to the first terminal of the third capacitor C3.

The fourth current amplification sub-module P14 comprises a sixteenth transistor T16, a seventeenth transistor T17, an eighteenth transistor T18, a nineteenth transistor T19, a twentieth transistor T20 and a fourth capacitor C4. The sixteenth transistor T16 has a gate connected to the second input signal terminal INPUT 2, a source connected to the fourth clock signal terminal CLK4, and a drain connected to a gate and a source of the seventeenth transistor T17. The gate of the seventeenth transistor T17 is connected to the source of the seventeenth transistor T17, and the seventeenth transistor T17 has a drain connected to a gate of the eighteenth transistor T18, a gate of the nineteenth transistor T19, a drain of the twentieth transistor T20 and a first terminal of the fourth capacitor C4. The gate of the eighteenth transistor T18 is connected to the gate of the nineteenth transistor T19, the drain of the twentieth transistor T20 and the first terminal of the fourth capacitor C4. The eighteenth transistor T18 has a source connected to the third clock signal terminal CLK3 and a drain connected to a second terminal of the fourth capacitor C4. The gate of the nineteenth transistor T19 is connected to the drain of the twentieth transistor T20 and the first terminal of the fourth capacitor C4, and the nineteenth transistor T19 has a source connected to the high level terminal VGH and a drain connected to the output terminal OUT of the inverter. The twentieth transistor T20 has a gate connected to the first input signal terminal INPUT 1 and a source connected to the low level terminal VGL, and the drain of the twentieth transistor T20 is connected to the first terminal of the fourth capacitor C4.

The pull-down module P2 comprises a twenty-first transistor T21 having a gate connected to the first input signal terminal INPUT 1, a source connected to the low level terminal VGL, and a drain connected to the output terminal OUT of the inverter.

The respective connection relationships among the first current amplification sub-module P11, the second current amplification sub-module P12, the third current amplification sub-module P13, the fourth current amplification sub-module P14 and the pull-down module P2 will be described as follows.

The gate of the first transistor T1 is connected to the gate of the sixth transistor T6, the gate of the eleventh transistor T11 and the gate of the sixteenth transistor T16. The source of the fourth transistor T4 is connected to the drain of the ninth transistor T9, the source of the fourteenth transistor T14, the drain of the nineteenth transistor T19 and the drain of the twenty-first transistor T21. The gate of the fifth transistor T5 is connected to the gate of the tenth transistor T10, the gate of the fifteenth transistor T15, the gate of the twentieth transistor T20 and the gate of the twenty-first transistor T21. The gate of the sixth transistor T6 is connected to the gate of the eleventh transistor T11 and the gate of the sixteenth transistor T16. The gate of the eleventh transistor T11 is connected to the gate of the sixteenth transistor T16. The drain of the ninth transistor T9 is connected to the source of the fourteenth transistor T14, the drain of the nineteenth transistor T19 and the drain of the twenty-first transistor T21. The gate of the tenth transistor T10 is connected to the gate of the fifteenth transistor T15, the gate of the twentieth transistor T20 and the gate of the twenty-first transistor T21. The source of the fourteenth transistor T14 is connected to the drain of the nineteenth transistor T19 and the drain of the twenty-first transistor T21. The drain of the nineteenth transistor T19 is connected to the drain of the twenty-first transistor T21. The gate of the twentieth transistor T20 is connected to the gate of the twenty-first transistor T21.

It is to be noted that resistors and capacitors at the output terminal OUT of the inverter may be equivalently considered as an equivalent resistance R and an equivalent capacitance C5.

Figure 4:
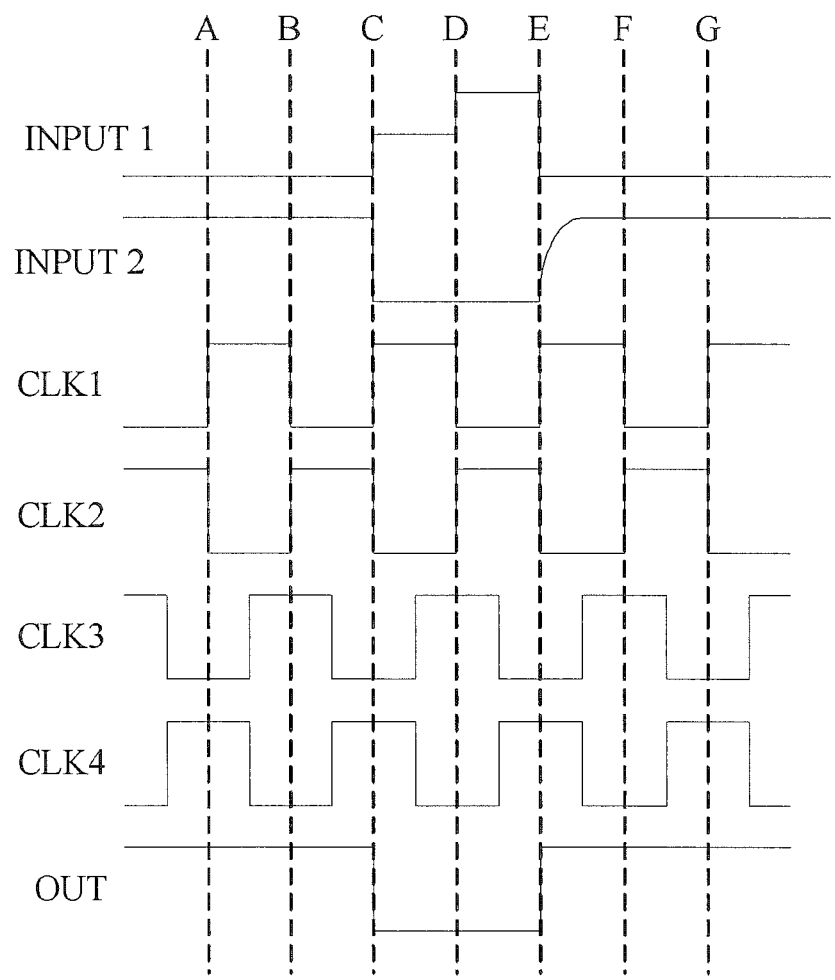
FIG. 4 is a signal timing diagram corresponding to the inverter of FIG. 3.

Herein, there is no limitation on types of various transistors in the above embodiments. Referring to FIG. 4, the transistors will be exemplified as N-type transistors by way of an example, so as to describe a method for driving the inverter. It is to be noted that when the transistors in the above embodiments are of other types, the corresponding circuit will also fall within the scope of the present disclosure. Moreover, a low level signal in the following description will have a negative voltage. A method for driving the inverter may comprise the following phases.

First Phase (Phase from A to B)

A signal at the first input signal terminal INPUT 1 and a signal at the second clock signal terminal CLK2 are both low level signals. A signal at the second input signal terminal INPUT 2 and a signal at the first clock signal terminal CLK1 are both high level signals. The first transistor T1, the sixth transistor T6, the eleventh transistor T11 and the sixteenth transistor T16 are all on, and the fifth transistor T5, the tenth transistor T10, the fifteenth transistor T15, the twentieth transistor T20 and the twenty-first transistor T21 are all off. The gate of the second transistor T2 receives the high level signal of the first clock signal terminal CLK1 transmitted through the first transistor T1, and thus the second transistor T2 is on and charges the first terminal of the first capacitor C1 with the high level signal of the first clock signal terminal CLK1. The third transistor T3 and the fourth transistor T4 are both on, and charge the second terminal of the first capacitor C1 with the low level signal of the second clock signal terminal CLK2. The source of the fourth transistor T4 is at a high level. The gate of the seventh transistor T7 receives the low level signal of the second clock signal terminal CLK2, and thus the seventh transistor T7 is off. The second capacitor C2 stays in the high level state of the previous phase to the first phase due to bootstrapping, and thus the eighth transistor T8 and the ninth transistor T9 are both on. The eighth transistor T8 charges the second terminal of the second capacitor C2 with the high level signal of the first clock signal terminal CLK1. The bootstrapping of the second capacitor C2 and the charging with the high level signal of the first clock signal terminal CLK1 can increase a voltage at the gate of the eighth transistor T8 and a voltage at the gate of the ninth transistor T9, thereby increasing a gate-source voltage difference of the ninth transistor T9 while increasing a current provided from the ninth transistor T9 to the output terminal OUT of the inverter. Moreover, there is a high level signal at the drain of the ninth transistor T9.

The signal at the third clock signal terminal CLK3 is a low level signal in the first half of the first phase, and is a high level signal in the second half of the first phase. The signal at the fourth clock signal terminal CLK4 is a high level signal in the first half of the first phase, and is a low level signal in the second half of the first phase. In the first half of the first phase, the gate of the twelfth transistor T12 receives the low level signal of the third clock signal terminal CLK3 transmitted Hi through the eleventh transistor T11, and thus the transistor T12 is off. The third capacitor C3 stays in the high level state of the previous phase to the first phase due to bootstrapping, and thus the thirteenth transistor T13 and fourteenth transistor T14 are both on. The thirteenth transistor T13 charges the second terminal of the third capacitor C3 with the high level signal of the fourth clock signal terminal CLK4. The bootstrapping of the third capacitor C3 and the charging with the high level signal of the fourth clock signal terminal CLK4 can increase a voltage at the gate of the thirteenth transistor T13 and a voltage at the gate of the fourteenth transistor T14, thereby increasing a gate-source voltage difference of the fourteenth transistor T14 while increasing a current provided from the fourteenth transistor T14 to the output terminal OUT of the inverter. Moreover, there is a high level signal at the source of the fourteenth transistor T14. The gate of the seventeenth transistor T17 receives the high level signal of the fourth clock signal terminal CLK4 transmitted through the sixteenth transistor T16, and thus the seventeenth transistor T17 is on and charges the first terminal of the fourth capacitor C4 with the high level signal of the fourth clock signal terminal CLK4. The eighteenth transistor T18 and the nineteenth transistor T19 are both on and charge the second terminal of the fourth capacitor C4 with the low level signal of the third clock signal terminal CLK3. There is a high level signal at the source of the nineteenth transistor T19. In the second half of the first phase, the gate of the twelfth transistor T12 receives the high level signal of the third clock signal terminal CK3 transmitted through the eleventh transistor T11, and thus the twelfth transistor T12 is on and charges the first terminal of the third capacitor C3 with the high level signal of the third clock signal terminal CLK3. The thirteenth transistor T13 and fourteenth transistor T14 are both on, and charge the second terminal of the third capacitor C3 with the low level signal of the fourth clock signal terminal CLK4. There is a high level signal at the source of the fourteenth transistor T14. The gate of the seventeenth transistor T17 receives the low level signal of the fourth clock signal terminal CLK4 transmitted through the sixteenth transistor T16, and thus the seventeenth transistor T17 is off. The fourth capacitor C4 stays in the high level state of the first half of the first phase due to bootstrapping, and thus the eighteenth transistor T18 and nineteenth transistor T19 are both on. The eighteenth transistor T18 charges the second terminal of the fourth capacitor C4 with the high level to signal of the third clock signal terminal CLK3. The bootstrapping of the fourth capacitor C4 and the charging with the high level signal of the third clock signal terminal CLK3 can increase a voltage at the gate of the eighteenth transistor T18 and a voltage at the gate of the nineteenth transistor T19, thereby increasing a gate-source voltage difference of the nineteenth transistor T19 while increasing a is current provided from the nineteenth transistor T19 to the output terminal OUT of the inverter. Moreover, there is a high level signal at the drain of the nineteenth transistor T19, i.e., the output terminal OUT of the inverter outputs a high level signal.

Second Phase (Phase from B to C)

A signal at the first input signal terminal INPUT 1 and a signal at the first clock signal terminal CLK1 are both low level signals. A signal at the second input signal terminal INPUT 2 and a signal at the second clock signal terminal CLK2 are both high level signals. The first transistor T1, the sixth transistor T6, the eleventh transistor T11 and the sixteenth transistor T16 are all on, and the fifth transistor T5, the tenth transistor T10, the fifteenth transistor T15, the twentieth transistor T20 and the twenty-first transistor T21 are all off. The gate of the second transistor T2 receives the low level signal of the first clock signal terminal CLK1, and thus the second transistor T2 is off. The first capacitor C1 stays in the high level state of the first phase due to bootstrapping, and thus the third transistor T3 and the fourth transistor T4 are both on. The third transistor T3 charges the second terminal of the first capacitor C1 with the high level signal of the second clock signal terminal CLK2. The bootstrapping of the first capacitor C1 and the charging with the high level signal of the second clock signal terminal CLK2 can increase a voltage at the gate of the third transistor T3 and a voltage at the gate of the fourth transistor T4, thereby increasing a gate-source voltage difference of the fourth transistor T4 while increasing a current provided from the fourth transistor T4 to the output terminal OUT of the inverter. Moreover, there is a high level signal at the source of the fourth transistor T4. The gate of the seventh transistor T7 receives the high level signal of the second clock signal terminal CLK2 transmitted through the sixth transistor T6, and thus the seventh transistor T7 is on and charges the first terminal of the second capacitor C2 with the high level signal at the second clock signal terminal CLK2. The eighth transistor T8 and the ninth transistor T9 are both on and charge the second terminal of the second capacitor C2 with the low level signal of the first clock signal terminal CLK1. There is a high level signal at the source of the ninth transistor T9.

The signal at the third clock signal terminal CLK3 is a high level signal in the first half of the second phase, and is a low level signal in the second half of the second phase. The signal at the fourth clock signal terminal CLK4 is a low level signal in the first half of the second phase, and is a high level signal in the second half of the second phase. In the first half of the second phase, the gate of the twelfth transistor T12 receives the high level signal of the third clock signal terminal CLK3 transmitted through the eleventh transistor T11, and thus the transistor T12 is on and charges the first terminal of the third capacitor C3 with the high level signal of the third clock signal terminal CLK3. The thirteenth transistor T13 and fourteenth transistor T14 are both on, and charge the second terminal of the third capacitor C3 with the low level signal of the fourth clock signal terminal CLK4. There is a high level signal at the source of the fourteenth transistor T14. The gate of the seventeenth transistor T17 receives the low level signal of the fourth clock signal terminal CLK4 transmitted through the sixteenth transistor T16, and thus the seventeenth transistor T17 is off. The fourth capacitor C4 stays in the high level state of the second half of the first phase due to bootstrapping. The eighteenth transistor T18 and the nineteenth transistor T19 are both on. The eighteenth transistor T18 charges the second terminal of the fourth capacitor C4 with the high level signal of the third clock signal terminal CLK3. The bootstrapping of the fourth capacitor C4 and the charging with the high level signal of the third clock signal terminal CLK3 can increase a voltage at the gate of the eighteenth transistor T18 and a voltage at the gate of the nineteenth transistor T19, thereby increasing a gate-source voltage difference of the nineteenth transistor T19 while increasing a current provided from the nineteenth transistor T19 to the output terminal OUT of the inverter. Moreover, there is a high level signal at the source of the nineteenth transistor T19. In the second half of the second phase, the gate of the twelfth transistor T12 receives the low level signal of the third clock signal terminal CK3 transmitted through the eleventh transistor T11, and thus the twelfth transistor T12 is off. The third capacitor C3 stays in the high level state of the first half of the second phase due to bootstrapping, and thus the thirteenth transistor T13 and fourteenth transistor T14 are both on. The thirteenth transistor T13 charges the second terminal of the third capacitor C3 with the high level signal of the fourth clock signal terminal CLK4. The bootstrapping of the third capacitor C3 and the charging with the high level signal of the fourth clock signal terminal CLK4 can increase a voltage at the gate of the thirteenth transistor T13 and a voltage at the gate of the fourteenth transistor T14, thereby increasing a gate-source voltage difference of the fourteenth transistor T14 while increasing a current provided from the fourteenth transistor T14 to the output terminal OUT of the inverter. Moreover, there is a high level signal at the source of the fourteenth transistor T14. The gate of the seventeenth transistor T17 receives the high level signal of the fourth clock signal terminal CLK4 transmitted through the sixteenth transistor T16, and thus the seventeenth transistor T17 is on and charges the first terminal of the fourth capacitor C4 with the high level signal of the fourth clock signal terminal CLK4. The eighteenth transistor T18 and the nineteenth transistor T19 are both on and charge the second terminal of the fourth capacitor C4 with the low level signal of the third clock signal terminal CLK3. There is a high level signal at the source of the nineteenth transistor T19. That is, the output terminal OUT of the inverter is at a high level.

Third Phase (Phase from C to D)

A signal at the first input signal terminal INPUT 1 and a signal at the first clock signal terminal CLK1 are both high level signals. A signal at the second input signal terminal INPUT 2 and a signal at the second clock signal terminal CLK2 are both low level signals. The first transistor T1, the sixth transistor T6, the eleventh transistor T11 and the sixteenth transistor T16 are all off, and the fifth transistor T5, the tenth transistor T10, the fifteenth transistor T15, the twentieth transistor T20 and the twenty-first transistor T21 are all on. The low level signal at the low level terminal VGL connected to the drain of the fifth transistor T5 pulls down a potential across the first capacitor C1. Similarly, potentials across the second capacitor C2, the third capacitor C3 and the fourth capacitor C4 are also pulled down. None of the signal at the first clock signal terminal CLK1, the signal at the second clock signal terminal CLK2, the signal at the third clock signal terminal CLK3, and the signal at the fourth clock signal terminal CLK4 can be transmitted to the succeeding transistors. Therefore, none of the first current amplification sub-module P11, the second current amplification sub-module P12, the third current amplification sub-module P13 and the fourth current amplification sub-module P14 may operate. The twenty-first transistor T21 is on, and thus its drain is at a low level. That is, the output terminal OUT of the inverter is at a low level.

Fourth Phase (Phase from D to E)

A signal at the first input signal terminal INPUT 1 and a signal at the second clock signal terminal CLK2 are both high level signals. A signal at the second input signal terminal INPUT 2 and a signal at the first clock signal terminal CLK1 are both low level signals. The first transistor T1, the sixth transistor T6, the eleventh transistor T11 and the sixteenth transistor T16 are all off, and the fifth transistor T5, the tenth transistor T10, the fifteenth transistor T15, the twentieth transistor T20 and the twenty-first transistor T21 are all on. The low level signal at the low level terminal VGL connected to the drain of the fifth transistor T5 pulls down a potential across the first capacitor C1 Similarly, potentials across the second capacitor C2, the third capacitor C3 and the fourth capacitor C4 are also pulled down. None of the signal at the first clock signal terminal CLK1, the signal at the second clock signal terminal CLK2, the signal at the third clock signal terminal CLK3, and the signal at the fourth clock signal terminal CLK4 can be transmitted to the succeeding transistors. Therefore, none of the first current amplification sub-module P11, the second current amplification sub-module P12, the third current amplification sub-module P13 and the fourth current amplification sub-module P14 may operate. The twenty-first transistor T21 is on, and thus its drain is at a low level. That is, the output terminal OUT of the inverter is at a low level.

Fifth Phase (Phase from E to F)

The driving method for the fifth phase is basically the same as that for the first phase, and details explanations for which may be found by referring to the first phase. It is to be noted that, in the practice driving, generation of the signal at the second input signal terminal INPUT 2 would be a little later than generation of the signal at the first input signal terminal INPUT 1. Therefore, gate voltages of the third transistor T3, the fourth transistor T4, the eighth transistor T8, the ninth transistor T9, the thirteenth transistor T13, the fourteenth transistor T14, the eighteenth transistor T18 and the nineteenth transistor T19 in the fifth phase would be slightly lower than gate voltages of these transistors in the first phase. But, its effect on the current outputted from the output terminal OUT of the inverter may be ignored.

Six Phase (Phase from F to G)

The driving method for the sixth phase is basically the same as that for the second phase, details explanations for which may be found by referring to the second phase. It is to be noted that, in the practice driving, generation of the signal at the second input signal terminal INPUT 2 would be a little later than generation of the signal at the first input signal terminal INPUT 1. Therefore, gate voltages of the third transistor T3, the fourth transistor T4, the eighth transistor T8, the ninth transistor T9, the thirteenth transistor T13, the fourteenth transistor T14, the eighteenth transistor T18 and the nineteenth transistor T19 in the sixth phase would be slightly lower than gate voltages of these transistors in the second phase. But, its effect on the current outputted from the output terminal OUT of the inverter may be ignored.

It is to be noted that a voltage of the low level signal at the low level terminal VGL and a voltage of the high level signal at the high level terminal VGH as mentioned above may be configured depending on specific attributes of respective transistors. For example, low level signals or high level signals inputted to transistors in the first current amplification sub-module, the second current amplification sub-module, the third current amplification sub-module, the fourth current amplification sub-module and the pull-down module might be different. As shown in FIG. 3, high level signals at high level terminals VGHs inputted to the fourth transistor T4, the ninth transistor T9, the fourteenth transistor T14 and the nineteenth transistor T19, respectively, may have totally different voltages or partly different voltages or the same voltages, and low level signals at low level terminals VGLs inputted to the fifth transistor T5, the tenth transistor T10, the fifteenth transistor T15, the twentieth transistor T20 and the twenty-first transistor T21, respectively, may have totally different voltages or partly different voltages or the same voltages.

Fourth Embodiment

Figure 5:
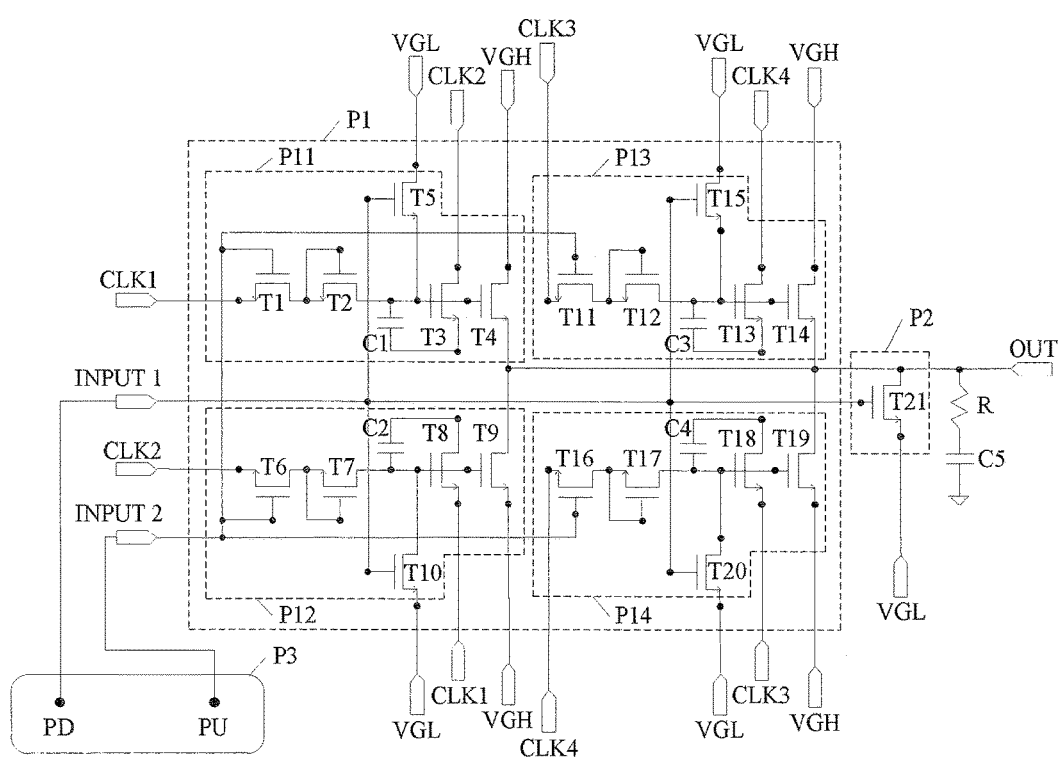
FIG. 5 is a structure diagram of a gate driving circuit according to a fourth embodiment of the present disclosure.

Referring to FIG. 5, a gate driving circuit according to this embodiment of the present disclosure comprises a plurality of stages of shift register units P3. Each stage shift register unit P3 is connected to the inverter according to the above embodiments. The inverter in the gate driving circuit involves the same advantages as the inverter according to the above embodiments, and thus will not be explained here. In particular, a pull-down control node PD and a pull-up control node PU of the shift register unit P3 is connected to the inverter, respectively. The pull-down control node PD is connected to the first input signal terminal INPUT 1 and configured to provide a signal to the first input signal terminal INPUT 1. The pull-up control node PU is connected to the second input signal terminal INPUT 2 and configured to provide a signal to the second input signal terminal INPUT 2. Herein, since the related technology for the shift register unit P3 has been mature, any appropriate already known structure may be applied in the shift register unit P3.

It is to be noted that generation of the signal at the second input signal terminal INPUT 2 would be a little later than generation of the signal at the first input signal terminal INPUT 1. The amplitude of the signal at the second input signal terminal INPUT 2 may decline during a climbing period, but will reach a normal value after several clock periods. Thereby, the amplitude of the voltage at the output terminal OUT of the inverter and the maximum output current capability will achieve respective desired ones.

Fifth Embodiment

According to this embodiment, a display apparatus is provided. The display apparatus comprises the gate driving circuit according to the fourth embodiment.

The gate driving circuit in the display apparatus involves the same advantages at that in the fourth embodiment, and thus will not be explained here. In particular, the display apparatus may be an organic light emitting diode display panels, an electronic paper, a mobile phone, a tablet, a TV set, a monitor, a notebook computer, a digital photo frame, a navigation device and any other products or parts having a display function.

Various alternatives and modifications can be made to the embodiments of the present disclosure by those skilled in the art without departing from the spirit and scope of the present disclosure. The scope of the present disclosure is defined only by the claims as attached and the equivalents thereof.

What is claimed is:

1. An inverter, comprising:
   a current amplification module connected to a first clock signal terminal, a second clock signal terminal, a third clock signal terminal, a fourth clock signal terminal, a first input signal terminal, a second input signal terminal, a high level terminal, a low level terminal and an output terminal of the inverter, and configured to amplify a current at the output terminal of the inverter based on a signal at the first clock signal terminal, a signal at the second clock signal terminal, a signal at the third clock signal terminal, a signal at the fourth clock signal terminal, a signal at the first input signal terminal and a signal at the second input signal terminal, and to control the output terminal of the inverter to output a high level signal; and
   a pull-down module connected to the first input signal terminal, the low level terminal and the output terminal of the inverter, and configured to control the output terminal of the inverter to output a low level signal;
   wherein the current amplification module comprises:
   a first current amplification sub-module connected to the first clock signal terminal, the second clock signal terminal, the first input signal terminal, the second input signal terminal, the high level terminal, the low level terminal and the output terminal of the inverter, and configured to amplify a current fed into the output terminal of the inverter based on a signal at the first clock signal terminal, a signal at the second clock signal terminal, a signal at the first input signal terminal and a signal at the second input signal terminal, and to control the output terminal of the inverter to output a high level signal;
   a second current amplification sub-module connected to the first clock signal terminal, the second clock signal terminal, the first input signal terminal, the second input signal terminal, the high level terminal, the low level terminal and the output terminal of the inverter, and configured to amplify a current fed into the output terminal of the inverter based on a signal at the first clock signal terminal, a signal at the second clock signal terminal, a signal at the first input signal terminal and a signal at the second input signal terminal, and to control the output terminal of the inverter to output a high level signal;
   a third current amplification sub-module connected to the third clock signal terminal, the fourth clock signal terminal, the first input signal terminal, the second input signal terminal, the high level terminal, the low level terminal and the output terminal of the inverter, and configured to amplify a current fed into the output terminal of the inverter based on a signal at the third clock signal terminal, a signal at the fourth clock signal terminal, a signal at the first input signal terminal and a signal at the second input signal terminal, and to control the output terminal of the inverter to output a high level signal; and
   a fourth current amplification sub-module connected to the third clock signal terminal, the fourth clock signal terminal, the first input signal terminal, the second input signal terminal, the high level terminal, the low level terminal and the output terminal of the inverter, and configured to amplify a current fed into the output terminal of the inverter based on a signal at the third clock signal terminal, a signal at the fourth clock signal terminal, a signal at the first input signal terminal and a signal at the second input signal terminal, and to control the output terminal of the inverter to output a high level signal;
   wherein the first current amplification sub-module comprises a first transistor, a second transistor, a third transistor, a fourth transistor, a fifth transistor and a first capacitor,
   wherein the first transistor has a gate connected to the second input signal terminal, a source connected to the first clock signal terminal, and a drain connected to a gate and a source of the second transistor,
   wherein the gate of the second transistor is connected to the source of the second transistor, and the second transistor has a drain connected to a gate of the third transistor, a gate of the fourth transistor, a source of the fifth transistor and a first terminal of the first capacitor,
   wherein the gate of the third transistor is connected to the gate of the fourth transistor, the source of the fifth transistor and the first terminal of the first capacitor, and the third transistor has a source connected to a second terminal of the first capacitor and a drain connected to the second clock signal terminal,
   wherein the gate of the fourth transistor is connected to the source of the fifth transistor and the first terminal of the first capacitor, and the fourth transistor has a source connected to the output terminal of the inverter and a drain connected to the high level terminal, and wherein the fifth transistor has a gate connected to the first input signal terminal and a drain connected to the low level terminal, and the source of the fifth transistor is connected to the first terminal of the first capacitor;

wherein the second current amplification sub-module comprises a sixth transistor, a seventh transistor, an eighth transistor, a ninth transistor, a tenth transistor and a second capacitor, wherein the sixth transistor has a gate connected to the second input signal terminal, a source connected to the second clock signal terminal, and a drain connected to a gate and a source of the seventh transistor, wherein the gate of the seventh transistor is connected to the source of the seventh transistor, and the seventh transistor has a drain connected to a gate of the eighth transistor, a gate of the ninth transistor, a drain of the tenth transistor and a first terminal of the second capacitor, wherein the gate of the eighth transistor is connected to the gate of the ninth transistor, the drain of the tenth transistor and the first terminal of the second capacitor, and the eighth transistor has a source connected to the first clock signal terminal and a drain connected to a second terminal of the second capacitor;

wherein the gate of the ninth transistor is connected to the drain of the tenth transistor and the first terminal of the second capacitor, and the ninth transistor has a source connected to the high level terminal and a drain connected to the output terminal of the inverter, and wherein the tenth transistor has a gate connected to the first input signal terminal and a source connected to the low level terminal, and the drain of the tenth transistor is connected to the first terminal of the second capacitor;

wherein the third current amplification sub-module comprises an eleventh transistor, a twelfth transistor, a thirteenth transistor, a fourteenth transistor, a fifteenth transistor and a third capacitor, wherein the eleventh transistor has a gate connected to the second input signal terminal, a source connected to the third clock signal terminal, and a drain connected to a gate and a source of the twelfth transistor, wherein the gate of the twelfth transistor is connected to the source of the twelfth transistor, and the twelfth transistor has a drain connected to a gate of the thirteenth transistor, a gate of the fourteenth transistor, a source of the fifteenth transistor and a first terminal of the third capacitor, wherein the gate of the thirteenth transistor is connected to the gate of the fourteenth transistor, the source of the fifteenth transistor and the first terminal of the third capacitor, and the thirteenth transistor has a source connected to a second terminal of the third capacitor and a drain connected to the fourth clock signal terminal, wherein the gate of the fourteenth transistor is connected to the source of the fifteenth transistor and the first terminal of the third capacitor, and the fourteenth transistor has a source connected to the output terminal of the inverter and a drain connected to the high level terminal, and wherein the fifteenth transistor has a gate connected to the first input signal terminal and a drain connected to the low level terminal, and the source of the fifteenth transistor is connected to the first terminal of the third capacitor;

wherein the fourth current amplification sub-module comprises a sixteenth transistor, a seventeenth transistor, an eighteenth transistor, a nineteenth transistor, a twentieth transistor and a fourth capacitor, wherein the sixteenth transistor has a gate connected to the second input signal terminal, a source connected to the fourth clock signal terminal, and a drain connected to a gate and a source of the seventeenth transistor, wherein the gate of the seventeenth transistor is connected to the source of the seventeenth transistor, and the seventeenth transistor has a drain connected to a gate of the eighteenth transistor, a gate of the nineteenth transistor, a drain of the twentieth transistor and a first terminal of the fourth capacitor, wherein the gate of the eighteenth transistor is connected to the gate of the nineteenth transistor, the drain of the twentieth transistor and the first terminal of the fourth capacitor, and the eighteenth transistor has a source connected to the third clock signal terminal and a drain connected to a second terminal of the fourth capacitor;

wherein the gate of the nineteenth transistor is connected to the drain of the twentieth transistor and the first terminal of the fourth capacitor, and the nineteenth transistor has a source connected to the high level terminal and a drain connected to the output terminal of the inverter, and wherein the twentieth transistor has a gate connected to the first input signal terminal and a source connected to the low level terminal, and the drain of the twentieth transistor is connected to the first terminal of the fourth capacitor.

2. The inverter of claim 1, wherein the pull-down module comprises a twenty-first transistor having a gate connected to the first input signal terminal, a source connected to the low level terminal, and a drain connected to the output terminal of the inverter.

3. The inverter of claim 2, wherein
the gate of the first transistor is connected to the gate of the sixth transistor, the gate of the eleventh transistor and the gate of the sixteenth transistor, wherein the source of the fourth transistor is connected to the drain of the ninth transistor, the source of the fourteenth transistor, the drain of the nineteenth transistor and the drain of the twenty-first transistor, wherein the gate of the fifth transistor is connected to the gate of the tenth transistor, the gate of the fifteenth transistor, the gate of the twentieth transistor and the gate of the twenty-first transistor, wherein the gate of the sixth transistor is connected to the gate of the eleventh transistor and the gate of the sixteenth transistor, wherein the gate of the eleventh transistor is connected to the gate of the sixteenth transistor, wherein the drain of the ninth transistor is connected to the source of the fourteenth transistor, the drain of the nineteenth transistor and the drain of the twenty-first transistor, wherein the gate of the tenth transistor is connected to the gate of the fifteenth transistor, the gate of the twentieth transistor and the gate of the twenty-first transistor, wherein the source of the fourteenth transistor is connected to the drain of the nineteenth transistor and the drain of the twenty-first transistor, wherein the drain of the nineteenth transistor is connected to the drain of the twenty-first transistor, and wherein the gate of the twentieth transistor is connected to the gate of the twenty-first transistor.

4. The inverter of claim 1, wherein a signal at the first clock signal terminal and a signal at the second clock signal terminal are opposite in phase, and a signal at the third clock signal terminal and a signal at the fourth clock signal terminal are opposite in phase.

5. The inverter of claim 4, wherein the signal at the first clock signal terminal has a raising edge or a falling edge corresponding to a high level or a low level of the signal at the third clock signal terminal.

6. A gate driving circuit, comprising a plurality of stages of shift register units, each of which is connected to the inverter of claim 1.

7. A display apparatus, comprising the gate driving circuit of claim 6.

8. The gate driving circuit of claim 6, wherein a pull-down control node and a pull-up control node of the shift register unit is connected to the inverter, respectively, and wherein the pull-down control node is connected to the first input signal terminal and configured to provide a signal to the first input signal terminal, and the pull-up control node is connected to the second input signal terminal and configured to provide a signal to the second input signal terminal.

9. The gate driving circuit of claim 8, wherein the pull-down module comprises a twenty-first transistor having a gate connected to the first input signal terminal, a source connected to the low level terminal, and a drain connected to the output terminal of the inverter.

* * * * *